United States Patent
Yen et al.

(10) Patent No.: US 8,258,878 B2
(45) Date of Patent: Sep. 4, 2012

(54) PHASE LOCKED LOOP AND METHOD THEREOF

(75) Inventors: Shih-Chieh Yen, Hsinchu Hsien (TW);
Yao-Chi Wang, Hsinchu Hsien (TW);
Hsu-Hung Chang, Hsinchu Hsien (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 62 days.

(21) Appl. No.: 12/893,662

(22) Filed: Sep. 29, 2010

(65) Prior Publication Data
US 2011/0102090 A1 May 5, 2011

(30) Foreign Application Priority Data
Oct. 30, 2009 (TW) .............................. 98136972 A

(51) Int. Cl.
*H03L 7/00* (2006.01)
(52) U.S. Cl. ................... 331/2; 331/10; 331/11; 331/12
(58) Field of Classification Search ............... 331/2, 10, 331/11, 12, 16, 17, 46, 47, 48
See application file for complete search history.

(56) References Cited

U.S. PATENT DOCUMENTS

| | | | | |
|---|---|---|---|---|
| 4,114,110 A | * | 9/1978 | Nossen | 331/2 |
| 4,234,929 A | * | 11/1980 | Riley, Jr. | 708/101 |
| 5,373,256 A | * | 12/1994 | Nicotra et al. | 331/2 |
| 6,005,443 A | * | 12/1999 | Damgaard et al. | 331/14 |
| 6,366,620 B1 | * | 4/2002 | Jackson et al. | 375/308 |
| 6,765,977 B1 | * | 7/2004 | Adams et al. | 375/376 |
| 7,352,249 B2 | * | 4/2008 | Balboni et al. | 331/16 |
| 2003/0231068 A1 | * | 12/2003 | Humphreys | 331/17 |

* cited by examiner

*Primary Examiner* — Joseph Chang
*Assistant Examiner* — Jeffrey Shin
(74) *Attorney, Agent, or Firm* — WPAT, PC; Justin King

(57) ABSTRACT

A phase locked loop (PLL) includes a clock generating circuit, a first phase detecting circuit, a first loop filter, a first VCO, a first mixer and a control circuit. The clock generating circuit generates a first clock signal. The first phase detecting circuit detects a phase difference between an input data signal and a feedback signal and generates a detection output signal according to the phase difference. The first loop filter, coupled to the first phase detecting circuit, generates a first VCO control signal according to the detection output signal. The first mixer, coupled to the first VCO and the clock generating circuit, mixes the output data signal and the first clock signal to generate the feedback data signal. The control circuit, coupled to the clock generating circuit and the first loop filter, for adjusting the first clock signal according to the first VCO control signal to calculate a gain of the first VCO.

8 Claims, 8 Drawing Sheets

(a)

(b)

PHASE LOCKED LOOP AND METHOD THEREOF

CROSS REFERENCE TO RELATED PATENT APPLICATION

This patent application is based on Taiwan, R.O.C. patent application No. 098136972 filed on Oct. 30, 2009.

FIELD OF THE INVENTION

The present invention relates to a phase locked loop (PLL) and a method thereof, and more particularly, to a PLL and a method thereof capable of calibrating a gain drift of a voltage-controlled oscillator (VCO).

BACKGROUND OF THE INVENTION

Generally, a gain drift of a VCO in a PLL may be generated due to some uncontrolled factors, e.g., variations of a manufacturing process, changes of an ambient temperature and changes of a power source, such that the PLL cannot remain at a predetermined close loop bandwidth in practical applications. More particularly, when an offset PLL is applied to a signal transmitting end of a wireless communication system, e.g., a transmitter of a Global System for Mobile Communication (GSM) system, a data signal is directly converted into a radio frequency (RF) signal, then the RF signal transmitted by a power amplifier. However, since the offset PLL transmitter comprises an intermediate frequency (IF) mixer for up-converting the transmitted data signal into an IF signal, the IF mixer also produces bandwidth noises. At this point, the offset PLL transmitter needs to remove the bandwidth noises produced by the IF mixer via a close-loop bandwidth. However, the close loop bandwidth of the offset PLL is undesirably affected by uncontrolled factors, e.g., variations of a manufacturing process variations, changes of an ambient temperature, and changes of a power source voltage, such that the close loop bandwidth cannot remain at a predetermined close-loop bandwidth. Therefore, a problem of calibrating the close loop bandwidth of the offset PLL to remain at the predetermined close loop bandwidth needs to be solved.

SUMMARY OF THE INVENTION

Therefore, one object of the present invention is to provide a PLL and a method thereof capable of calibrating a gain of a VCO.

According to an embodiment of the present invention, a PLL comprises a clock generating circuit, a first phase detecting circuit, a first loop filter, a first VCO, a first mixer and a control circuit. The clock generating circuit generates a first clock signal. The first phase detecting circuit detects a phase difference between an input data signal and a feedback signal and generates a detection output signal according to the phase difference. The first loop filter, coupled to the first phase detecting circuit, generates a first VCO control signal according to the detection output signal. The first mixer, coupled to the first VCO and the clock generating circuit, mixes the output data signal and the first clock signal to generate the feedback data signal. The control circuit, coupled to the clock generating circuit and the first loop filter, for adjusting the first clock signal according to the first VCO control signal to calculate a gain of the first VCO.

According to another embodiment of the present invention, a method for calibrating a close loop bandwidth of an offset PLL comprises determining a first reference frequency by adjusting a clock signal according to a VCO control signal and a first reference voltage until the VCO control signal approximately equals the first reference voltage; determining a second reference frequency by adjusting the clock signal according to the VCO control signal and a second reference voltage until the controls signal approximately equals the second reference voltage; and calculating the gain of the VCO according to the first reference voltage, the second reference voltage, the first reference frequency and the second reference frequency.

According to another embodiment of the present invention, a PLL comprises a phase detecting circuit, a loop filter, a VCO, a frequency divider and a control circuit. The phase detecting circuit detects a phase difference between an input data signal and a feedback data signal and generates a detection output signal according to the phase difference. The loop filter, coupled to the first phase detecting circuit, generates a first VCO control signal according to the detection output signal. The voltage controlled oscillator (VCO), coupled to the first loop filter, generates an output data signal according to the first VCO control signal. The frequency divider, coupled to the first VCO and the phase detector, frequency divides the output data signal to generate the feedback data signal. The control circuit, coupled to the frequency divider and the loop filter, adjusts the frequency divider according to the first VCO control signal to calculate a gain of the first VCO.

DETAILED DESCRIPTION OF THE PREFERRED EMBODIMENT

An object of the present invention is to provide a PLL and a method thereof capable of calibrating a gain of a VCO to calibrate gains of VCOs of various types of PLL. Take an offset PLL as an example in the following description of embodiments of the present invention.

Figure 1:
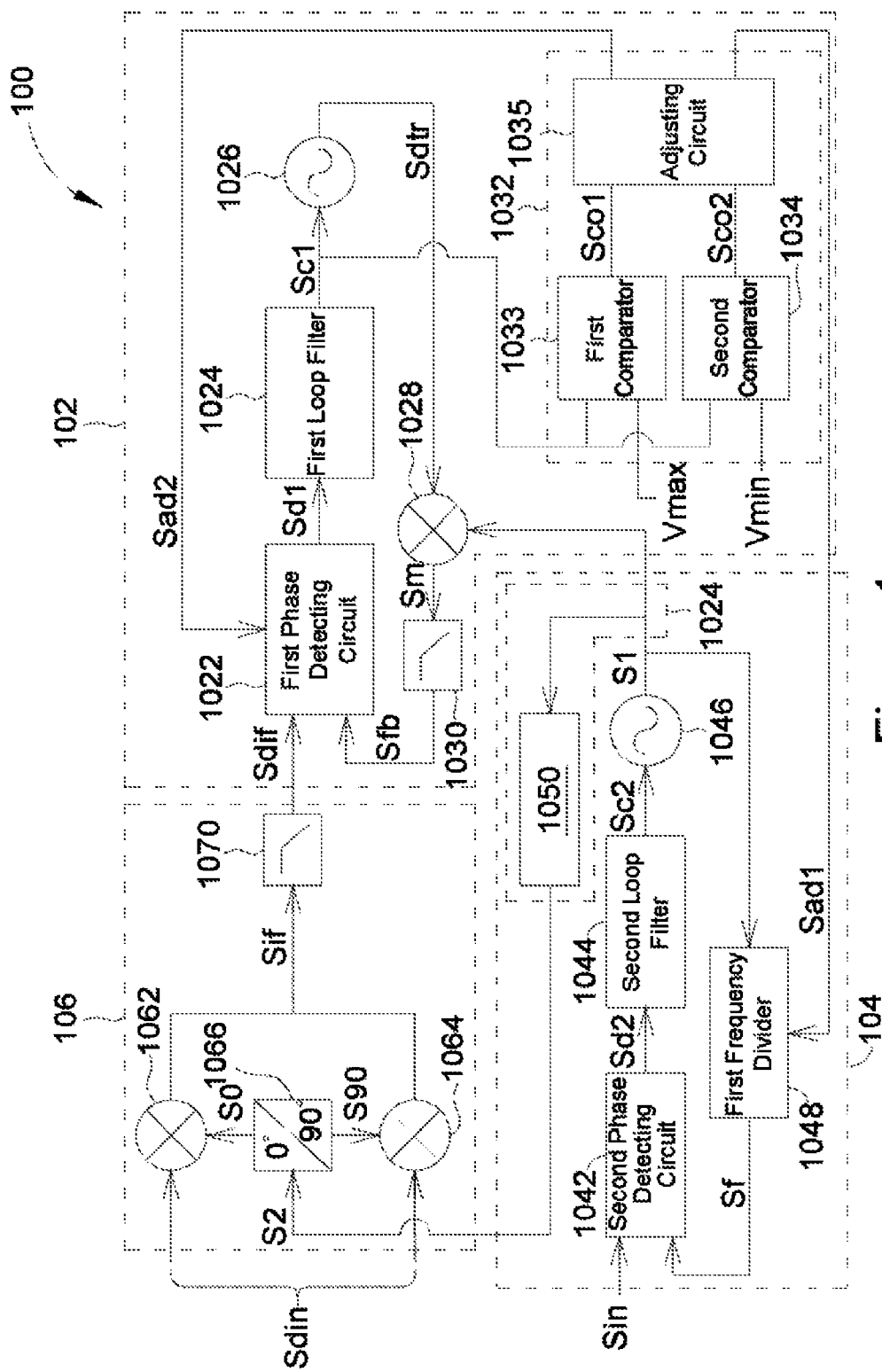
FIG. 1 is a schematic diagram of an offset PLL transmitter in accordance with an embodiment of the present invention.

Refer to FIG. 1 showing a schematic diagram of an offset PLL transmitter 100 in accordance with an embodiment of the present invention. The offset PLL transmitter 100 comprises an offset PLL 102, a clock generating circuit 104, and an IF signal processing circuit 106.

The offset PLL 102 comprises a first phase detecting circuit 1022, a first loop filter 1024, a first VCO 1026, a mixer 1028, a low-pass filter 1030, and a control circuit 1032. The first phase detecting circuit 1022 receives an IF data signal Sdif for detecting a phase difference between the IF data signal Sdif and an IF feedback data signal Sfb to generate a first detection output signal Sd1. The first loop filter 1024 coupled to the first phase detecting circuit 1022 filters the first detection output signal Sd1 to generate a first VCO control signal Sc1. It is to be noted that, the first detection output signal Sd1 being a current signal and the first VCO control signal Sc1 being a voltage signal are readily apparent to a person having ordinary skills in the art. In other words, the first loop filter 1024 also has a current-to-voltage function. The first VCO 1026 coupled to the first loop filter 1024 generates an RF data signal Sdtr according to the first VCO control signal Sc1. The mixer 1028 coupled to the first VCO 1026 to receive the Sdtr; and it also receives a first clock signal S1, and mixes the RF data signal Sdtr according to the first clock signal S1 to generate a mixed signal Sm that is transmitted to the low-pass filter 1030, so as to generate the IF feedback data signal Sfb.

The control circuit 1032, coupled to the first loop filter 1024 for receiving the first VCO control signal Sc1, estimates a gain Kvco of the first VCO 1026 in an estimation stage, and adjusts the first detection output signal Sd1 of the first phase detecting circuit 1022 in a calibration stage. More specifically, the control circuit 1032 comprises a first comparator 1033, a second comparator 1034, and an adjusting circuit 1035. In the estimation stage, the first comparator 1033 compares the first VCO control signal Sc1 with a first reference voltage level Vmax to generate a first comparison result Sco1, and the second comparator 1034 compares the first VCO control signal Sc1 with a second reference voltage level Vmin to generate a second comparison result Sco2. During this initial calibration, the adjusting circuit 1035 adjusts the first clock signal 51 according to the first comparison result Sco1 or the second comparison result Sco2 until the first VCO control signal Sc1 approximately equals to the first reference voltage level Vmax or the second reference voltage level Vmin. The adjusting circuit 1035 also records a fastest output clock frequency Fh (or referred to as a first reference frequency) corresponding to the first reference voltage level Vmax and a slowest output clock frequency Fl (or referred to as a second reference frequency) corresponding to the second reference voltage level Vmin. In the calibration stage, the adjusting circuit 1035 calculates the gain Kvco of the VCO 1026 according to the first reference voltage level Vmax, the second reference voltage level Vmin, the fast output clock frequency Fh, and the slowest output clock frequency Fl, and the adjusting circuit 1035 generates a adjustment signal Sad2 to adjust the first phase detecting circuit 1022's reference current Iref according to the gain Kvco, and by which it further adjusts a close loop bandwidth Fbw of the PLL 102.

At this point, the first clock signal S1 is generated by the clock generating circuit 104, which may be realized by a local oscillator. In this embodiment, the clock generating circuit 104 comprises a second phase detecting circuit 1042, a second loop filter 1044, a second VCO 1046, and a first frequency divider 1048. The second phase detecting circuit 1042 detects a phase difference between an input clock Sin and a feedback clock Sf to generate a second VCO control signal Sd2, so as to adjust the first clock signal 51. The first frequency divider 1048, coupled to the second VCO 1046 and the second phase detecting circuit 1042 frequency, has a first divisor Nd1 and divides the first clock signal 51 to generate the feedback clock Sf. The first frequency divider 1048 is controlled by the control circuit 1032 to adjust the first clock signal 51. More specifically, in the estimation stage, the adjusting circuit 1035 of the control circuit 1032 adjusts a divisor of the first frequency divider 1048 according to the first comparison result Sco1 and the second comparison result Sco2, respectively, so that the first VCO control signal Sc1 respectively approximately equals to the first reference voltage level Vmax or the second reference voltage level Vmin during this initial calibration. In addition, considering about requirements of the system, the clock generating circuit 104 may generate a second clock signal S2 according to the first clock signal S1 via a second frequency divider 1050, which frequency divides the first clock signal S1 via a divisor Nd3 to generate the second clock signal S2. The IF signal processing circuit 106 up-converts a to-be-transmitted data Sdin into an IF data signal Sdif via the second clock signal S2.

The IF signal processing circuit 106 coupled to the clock generating circuit 104 processes the to-be-transmitted data Sdin via the second clock signal S2 to generate the IF data signal Sdif. In this embodiment, the IF signal processing circuit 106 comprises a first mixer 1062, a second mixer 1064, a phase shifter 1066, and a low-pass filter 1070. The phase shifter 1066 generates two clocks S0 and S90 having a phase difference of 90 degrees according to the second clock signal S2, and may also replace the phase shifter 1066 with a frequency divider to generate the two clocks S0 and S90 having the phase difference of 90 degrees. The first mixer 1062 and the second mixer 1064 respectively mix the to-be-transmitted data Sdin according to the clocks S0 and S90 to generate an IF output data Sif. The low-pass filter 1070 low-pass filters the IF output data Sif to generate the IF data signal Sdif.

Figure 2:
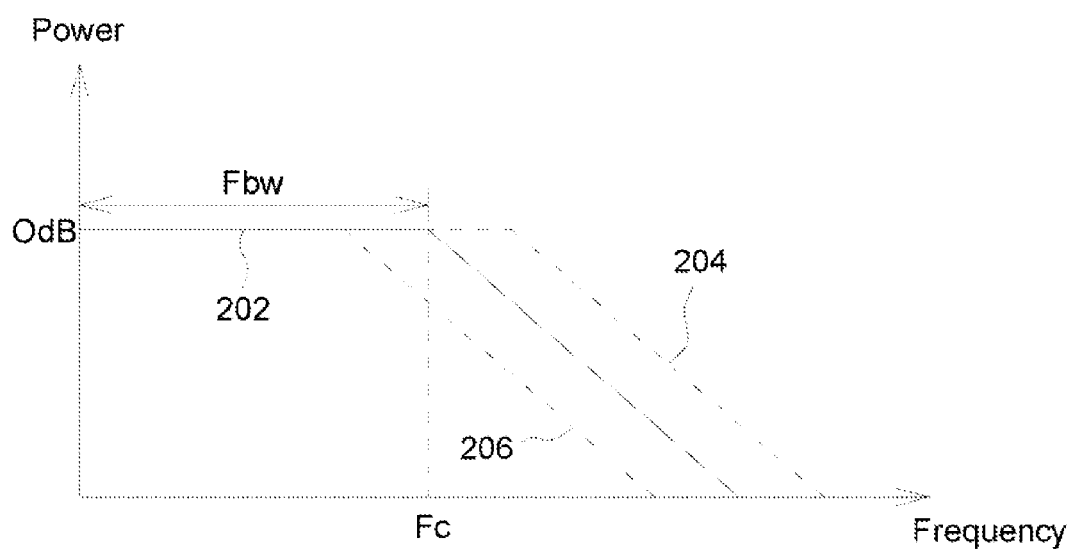
FIG. 2 is a bode diagram of an offset PLL of the offset PLL transmitter in FIG. 1.

Refer to FIG. 2 showing a schematic diagram of a loop frequency response of the offset PLL 102 of the offset PLL transmitter 100. A curve 202 (i.e., solid lines) is a predetermined frequency response curve of the offset PLL 102, and curves 204 and 206 (i.e., dashed lines) are frequency curves of the offset PLL 102 that is influenced by uncontrolled factors, e.g., variations of a manufacturing process, changes of an ambient temperature and changes of a power source voltage. More specifically, the foregoing uncontrolled factors may change a corner frequency Fc of the frequency response of the offset PLL 102. The corner frequency Fc is determined according to a reference current Iref of the first phase detecting circuit 1022, a component parameter of the first loop filter 1024, and the gain Kvco of the first VCO 1026 according to Equation (1):

$$Fc = \sqrt{Icp*Kvco/2\pi*Cp}, Icp = \alpha*Iref \quad (1)$$

Wherein, Cp is a capacitance of a capacitance component of the first loop filter 1024. In this embodiment, after the gain Kvco is calculated, the control circuit 1032 adjusts a control current Icp (i.e., I3 and I2 in FIG. 4) of the first phase detecting circuit 1022 according to the gain Kvco, such that the corner frequency Fc of the offset PLL 102 approximately stays unchanged, and thus the close loop bandwidth Fbw of the offset PLL 102 approximately stays unchanged. More specifically, the close loop bandwidth Fbw of the offset PLL 102 approximately stays unchanged by adjusting the control current Icp from adjusting the reference current Iref or a ratio of a current mirror 10223, or by adjusting the capacitance of a capacitance component Cp of the first loop filter 1024—such an adjusting circuit is readily apparent to a person having ordinary skills in the art and shall not be described for brevity.

Figure 3:
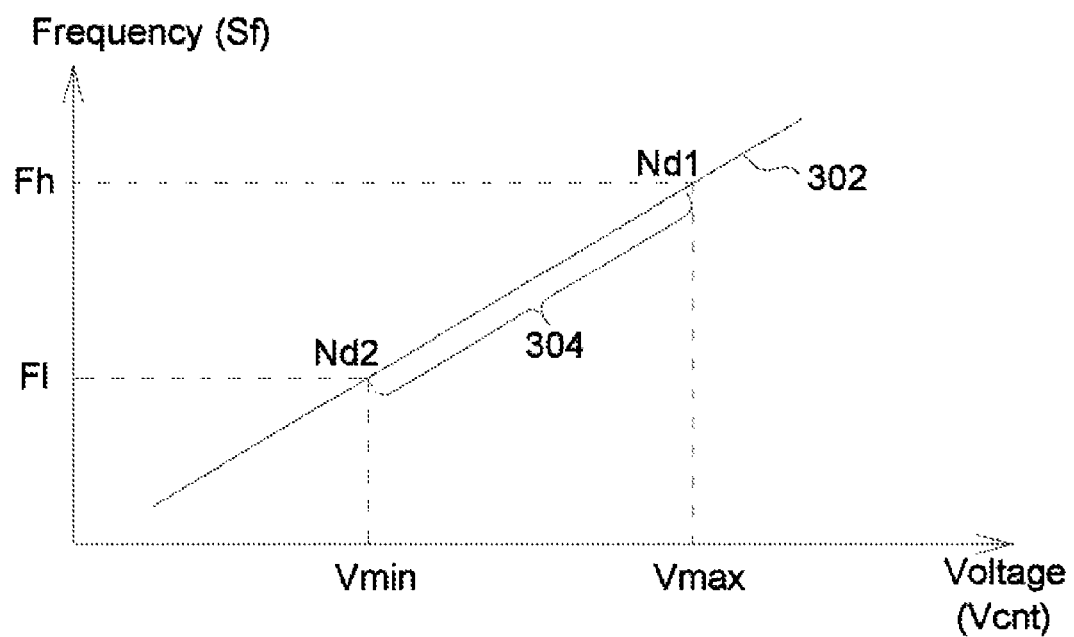
FIG. 3 is a voltage-frequency diagram between an input control voltage of a first VCO and an output clock frequency.

Refer to FIG. 3 showing a voltage-frequency curve between an input control voltage Vcnt and an output clock frequency Sf of the first VCO 1026 in FIG. 1. A gain Kvco of the first VCO 1026 is calculated according to a linear part of a curve 302, i.e., a partial curve 304 of the curve 302. The partial curve 304 has a first end corresponding to a highest voltage level (i.e., a first reference voltage level Vmax) and a fastest output clock frequency Fh, and a second end corresponding to a lowest voltage level (i.e., a second reference voltage level Vmin) and a lowest output clock frequency Fl. In addition, the first end of the curve 304 corresponds to a highest divisor (i.e., a first divisor Nd1) of the first frequency divider 1048, and the second end of the curve 304 corresponds to a lowest divisor (i.e., a second divisor Nd2). More specifically, the gain of the first VCO 1026 is calculated according to Equation (2):

$$Kvco = \Delta F / \Delta V \quad (2)$$
$$= (Fh - Fl)/(V\max - V\min)$$

In view of the foregoing issues, detailed operations of the control circuit 1032 of the offset PLL 102 in the estimation stage and in the calibration stage are described below.

Referring to FIG. 1 and FIG. 3, when the offset PLL transmitter 100 is activated, a baseband to-be-transmitted data Sdin is received. At this point, the clock generating circuit 104 generates a second clock signal S2 to the IF signal processing circuit 106 in order to mix the to-be-transmitted data Sdin to generate an IF data signal Sdif. Accordingly, the close loop bandwidth Fbw of the offset PLL 102 may not be a predetermined close loop bandwidth. Therefore, the control circuit 1032 first calibrates the close loop bandwidth Fbw of the offset PLL 102 to the predetermined close loop bandwidth. In the estimation stage, in order to obtain the fastest output clock frequency Fh generated when the input control voltage Vent of the first VCO 1026 equals the highest voltage level, the adjusting circuit 1035 generates a first adjustment signal Sad1 to adjust a divisor of the first frequency divider 1048, so that the first clock signal S1 is frequency divided, thus changing a clock frequency of the feedback clock Sfb. At this point, the clock frequencies of the second clock signal S2 and the first clock signal S1 are correspondingly changed.

The first phase detecting circuit 1022 detects a phase difference between the updated IF data signal Sdif and the updated IF feedback data signal Sfb to generate a first detection output signal Sd1. The first loop filter 1024 generates a first VCO control signal Sc1 according to the first detection output signal Sd1. The first comparator 1033 determines whether the first VCO control signal Sc1 reaches up to the first reference voltage level Vmax, and generates a first comparison result Sco1 to the adjusting circuit 1035. When the first VCO control signal Sc1 does not reach up to the first reference voltage level Vmax, the adjusting circuit 1035 continues to adjust the divisor of the first frequency divider 1025, such that the first VCO control signal Sc1 reaches up to the first reference voltage level Vmax. When the first VCO control signal Sc1 reaches up to the first reference voltage level Vmax, the fastest output clock reference Fh corresponding to the first reference voltage level Vmax is calculated as:

$$Fh = Nd1 * Fref\left(1 \pm \frac{1}{Nd3}\right) \quad (3)$$

Wherein, Fref is a clock reference of the input clock Sin, and the plus sign or the minus sign is determined according to configuration of the mixer 1028. More specifically, when the configuration of the mixer 1028 is high-side injection, the minus sign is selected; when the configuration of the mixer is low-side injection, the plus sign is selected. It is to be noted that, at this point, the divisor of the first frequency divider 1048 is the first divisor Nd1. Likewise, the adjusting circuit 1035 generates the first adjustment signal Sad1 for adjusting the divisor of the first frequency divider 1048 to frequency divide the first clock signal S1, so as to obtain a slowest output clock frequency Fl when the input control voltage Vent equals the lowest voltage level. When the first VCO control signal Sc1 reaches up to a second reference voltage level Vmin, the slowest output clock reference Fl corresponding to the second reference voltage level Vmin is calculated as:

$$Fl = Nd2 * Fref\left(1 \pm \frac{1}{Nd3}\right) \quad (4)$$

Wherein, Fref is the clock reference of the input clock Sin, the plus sign or the minus sign is determined according to configuration of the mixer 1028. More specifically, when the configuration of the mixer is the high-side injection, the minus sign is selected; when the configuration of the mixer is the low-side injection, the plus sign is selected. It is to be noted that, at this point, the divisor of the first frequency divider 1048 is the second divisor Nd2. Accordingly, the gain Kvco of the first VCO 1026 is calculated as:

$$Kvco = \Delta F / \Delta V \quad (5)$$
$$= (Fh - Fl)/(V\max - V\min)$$
$$= (Nd1 * Fref - Nd2 * Fref)\left(1 \pm \frac{1}{Nd3}\right)$$

In another embodiment of the present invention, another frequency divider, coupled between the second VCO 1046 and the mixer 1028, frequency divides the first clock signal 51 according to a fourth divisor Nd4 to generate a fourth clock S4. In this embodiment, the gain Kvco of the first VCO 1026 is calculated as:

$$Kvco = \Delta F / \Delta V \quad (6)$$
$$= (Fh - Fl)/(V\max - V\min)$$
$$= (Nd1 * Fref - Nd2 * Fref)\left(\frac{1}{Nd4} \pm \frac{1}{Nd3}\right)$$

It is to be noted that, derivation of Equation (6) is apparent to a person having ordinary skills in the art after having read the foregoing disclosure, and shall not be described for brevity.

During the calibration stage, when the gain Kvco of the first VCO 1026 is obtained, the adjusting circuit 1035 generates a second adjustment signal Sad2 according to Equation (1) to adjust the reference current Iref of the first phase detecting circuit 1022, such that the close loop bandwidth Fbw of the offset PLL 102 remains at a predetermined close loop bandwidth shown in FIG. 2.

Figure 4:
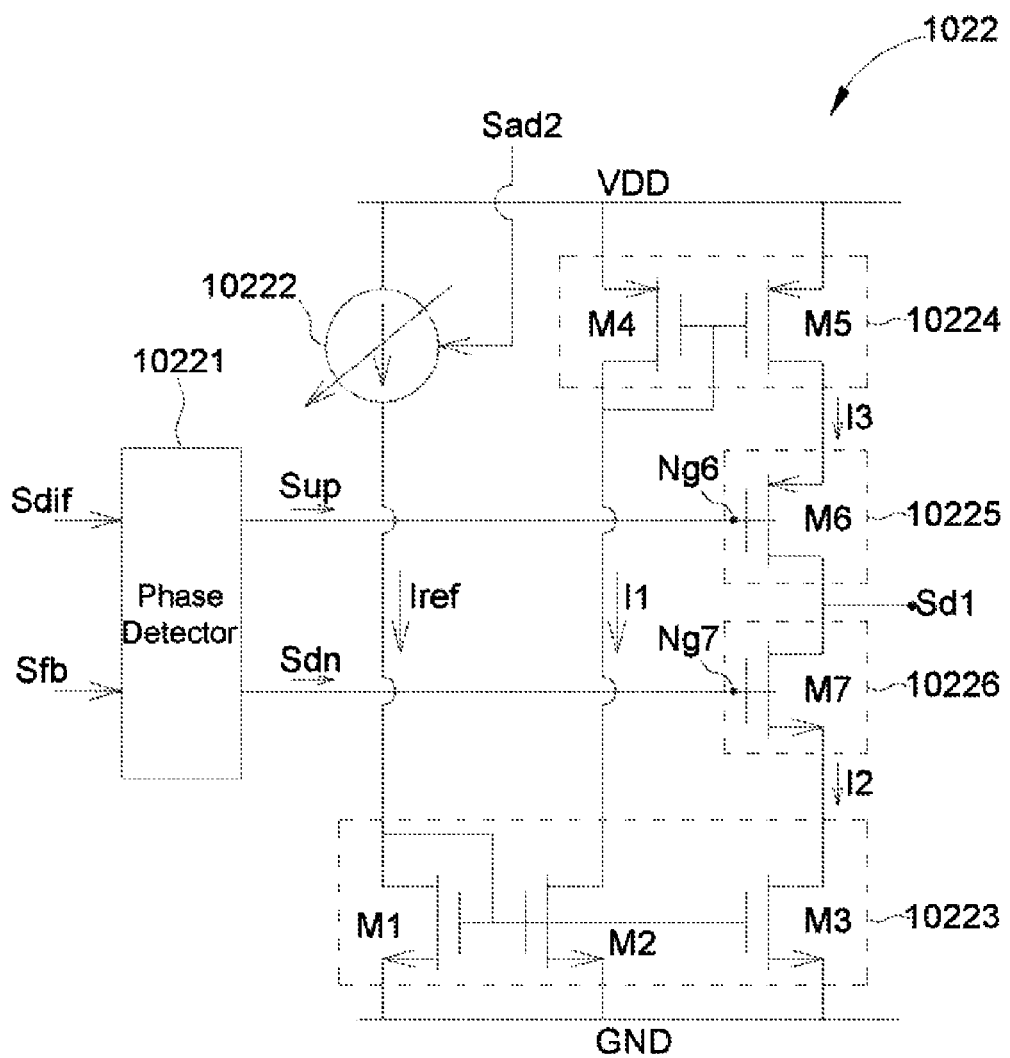
FIG. 4 is schematic diagram of detailed circuits of a first phase detecting circuit of the offset PLL transmitter in FIG. 1 in accordance with an embodiment of the present invention.

In order to further understand the present invention, FIG. 4 shows a schematic diagram of detailed circuits of the first phase detecting circuit 1022 of the offset PLL transmitter 100 in accordance with an embodiment of the present invention. The first phase detecting circuit 1022, coupled between a reference voltage VDD and a ground GND, comprises a phase detector 10221, a reference current source 10222, a first current mirror 10223, a second current mirror 10224, a first switch 10225, and a second switch 10226. The first phase detecting circuit 1022 generates reference currents I2 and I3 (i.e., Icp in Equation (1), and Icp is inversely proportional to a reference current Iref) according to the second adjustment signal Sad2. The reference current source 10222, being an adjustable current source, generates the reference current Iref. The first phase detecting circuit 1022 adjusts the reference current source 10222 to generate the corresponding reference current Iref according to the second adjustment signal Sad2, or adjusts a ratio of the first current mirror 10223, which comprises N-type field effect transistors (FET) M1, M2 and M3. The N-type FET M1 is a diode-connected N-type FET, the N-type FET M2 mirrors the reference current Iref to generate the first current I1, and the N-type FET M3 mirrors the reference current Iref to generate the second current I2, which is regarded as a first detection output signal Sd1. The second current mirror 10224 comprises P-type FETs M4 and M5. The P-type FET M4 is a diode-connected P-type FET, and the P-type FET M5 mirrors the first current I1 to generate a third current I3 that is regarded as the first detection output signal Sd1. In addition, the first switch 10225 is realized by a P-type FET M6, which has a gate Ng6 for receiving a leading signal Sup generated by the phase detector 10221. The leading signal Sup represents that a phase of an IF data signal Sdif leads a phase of an IF feedback data signal Sfb. The second switch 10226 is realized by an N-type FET M7, which has a gate Ng7 for receiving a lagged signal Sdn generated by the phase detector 10226. The lagged signal Sdn represents the phase of the IF data signal Sdif lags the phase of the IF feedback data signal Sfb. As observed from FIG. 4, when the reference current Iref of the first phase detecting circuit 1022 or the ratio of the first current mirror 10223 is adjusted according to the second adjustment signal Sad2, the second current I2 and the third current I3 are correspondingly adjusted, such that the corner frequency Fc of the offset PLL 102 approximately stays unchanged.

Figure 5:
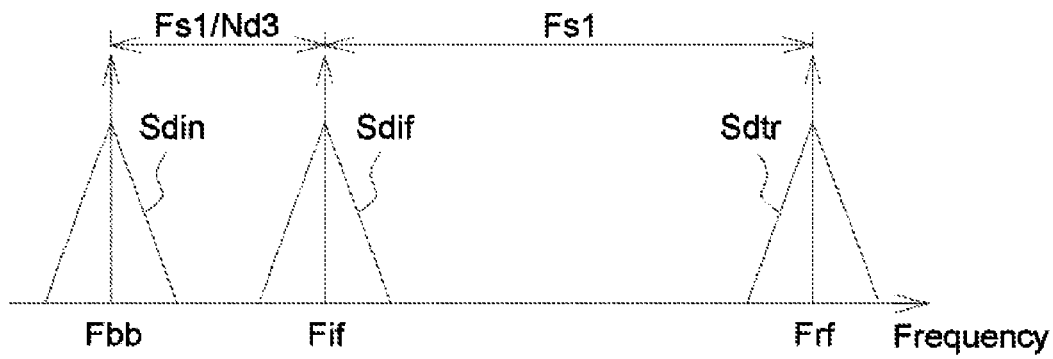
FIG. 5 shows spectrums of a to-be-transmitted signal, an IF data clock and an RF data signal.
Figure 5:
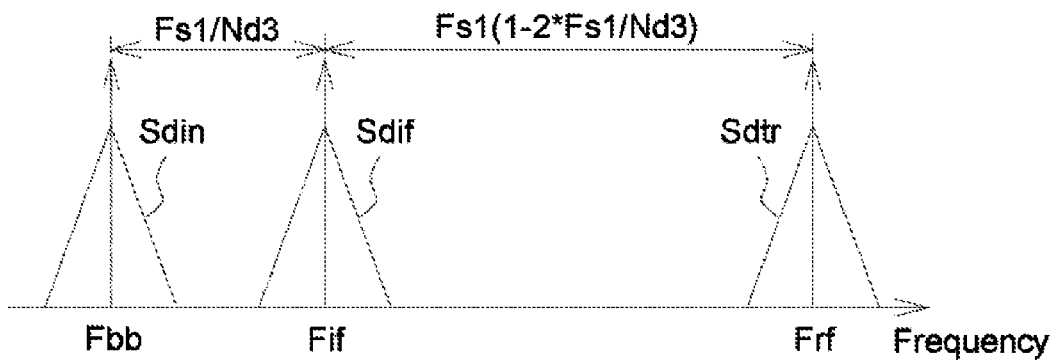

For a better understanding of the offset PLL transmitter 100 in accordance with another embodiment of the present invention, FIG. 5 shows spectrums of a to-be-transmitted signal Sdin, an IF data signal Sdif and an RF data signal Sdtr. FIG. 5a shows the spectrum when the mixer 1028 has the high-side injection configuration, and FIG. 5b shows the spectrum when the mixer 1028 has the low-side injection configuration. Central frequencies of the to-be-transmitted data Sdin, the IF data signal Sdif and the RF data signal Sdtr are marked by Fbb, Fif and Frf.

When the mixer 1028 has the high-side injection configuration, the central frequency Fbb of the baseband to-be-transmitted data Sdin is increased by $$\frac{Fs1}{Nd3}$$

as the IF signal processing 106 mixes the baseband to-be-transmitted data Sdin and a second clock signal S2 to generate the IF data signal Sdif, where Nd3 is a divisor for frequency dividing by the second frequency divider 1050 to divide the first clock signal S1 and to generate the second clock signal S2. The offset PLL 102 up-converts the IF data signal Sdif to the RF data signal Sdtr, such that the central frequency Fif of the IF data signal Sdif is increased by Fs1 that is a clock frequency of the first clock signal S1. In other words, when the adjusting circuit 1035 adjusts a divisor of the first frequency divider 1048 to change the clock frequency Fs1 of the first clock signal S1, the IF data signal Sdif and the IF feedback data signal Sfb have same central frequencies.

When the mixer 1028 has the low-side injection configuration, the central frequency Fif of the IF data signal Sdif is increased by (1-2*Fs1/Nd3) as the offset PLL 102 up-converts the IF data signal Sdif to the RF data signal Sdtr, where Fs is the clock frequency of the first clock signal, so that the IF data signal Sdif and the IF feedback data signal Sfb have same central frequencies. In other words, data distortion may not occur for that the central frequencies Fbb, Fif and Frf of the to-be-transmitted data Sdin, the IF data signal Sdif and the RF data signal Sdtr are too approximate to one another when the offset PPL transmitter 100 according to the present invention adjusts the divisor of the first frequency divider 1048.

It is to be noted that, another frequency dividing circuit, coupled between the second VCO 1046 and the mixer 1028, for frequency dividing the first clock signal S1 according to a fourth divisor Nd4 to generate a fourth clock S4, also having technique characteristics disclosed in FIG. 5 and generating same effects, is readily apparent to a person having ordinary skills in the art after having read the foregoing disclosure and shall not be described for brevity.

Figure 6:
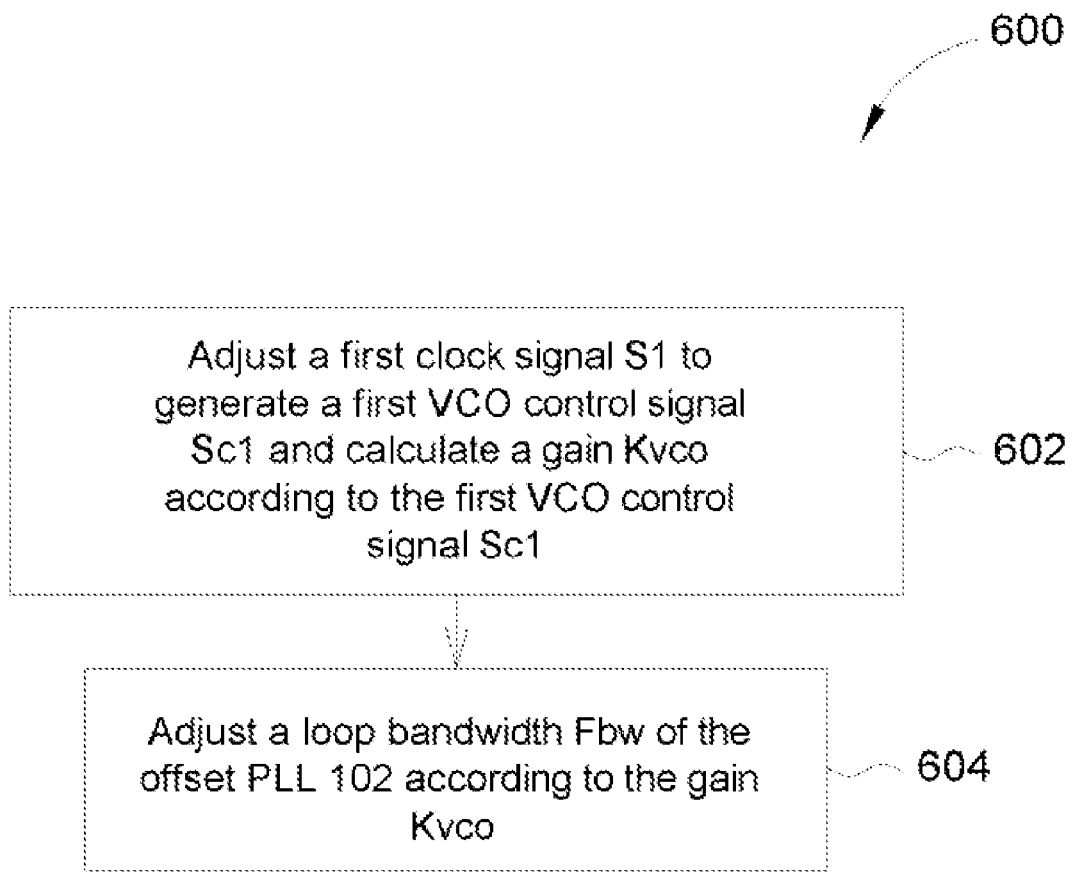
FIG. 6 is a Flow chart of a method for adjusting a close loop bandwidth of an offset PLL in accordance with an embodiment of the present invention.

The calibration method performed by the offset PLL transmitter 100 is simplified to steps in FIG. 6, i.e., Step 602 and Step 604. Refer to FIG. 6 showing a Flow chart of a method 600 for adjusting a close loop bandwidth Fbw of the offset PLL 102 in accordance with an embodiment of the present invention. Since the method 600 may be applied to the offset PLL transmitter 100, operations of the method 600 associated with the offset PLL transmitter 100 are to be described. A person having ordinary skills in the art knows that, the offset PLL transmitter 100 for realizing the method 600 is described for illustration purposes and is not a limitation of the present invention. The method 600 comprises steps below. In Step 602, adjust a first clock signal 51 to generate a first VCO control signal Sc1 and calculate a gain Kvco of the first VCO 1126 according to the first VCO control signal Sc1. In Step 604, adjust a close loop bandwidth Fbw of the offset PLL 102 according to the gain Kvco.

Figure 7:
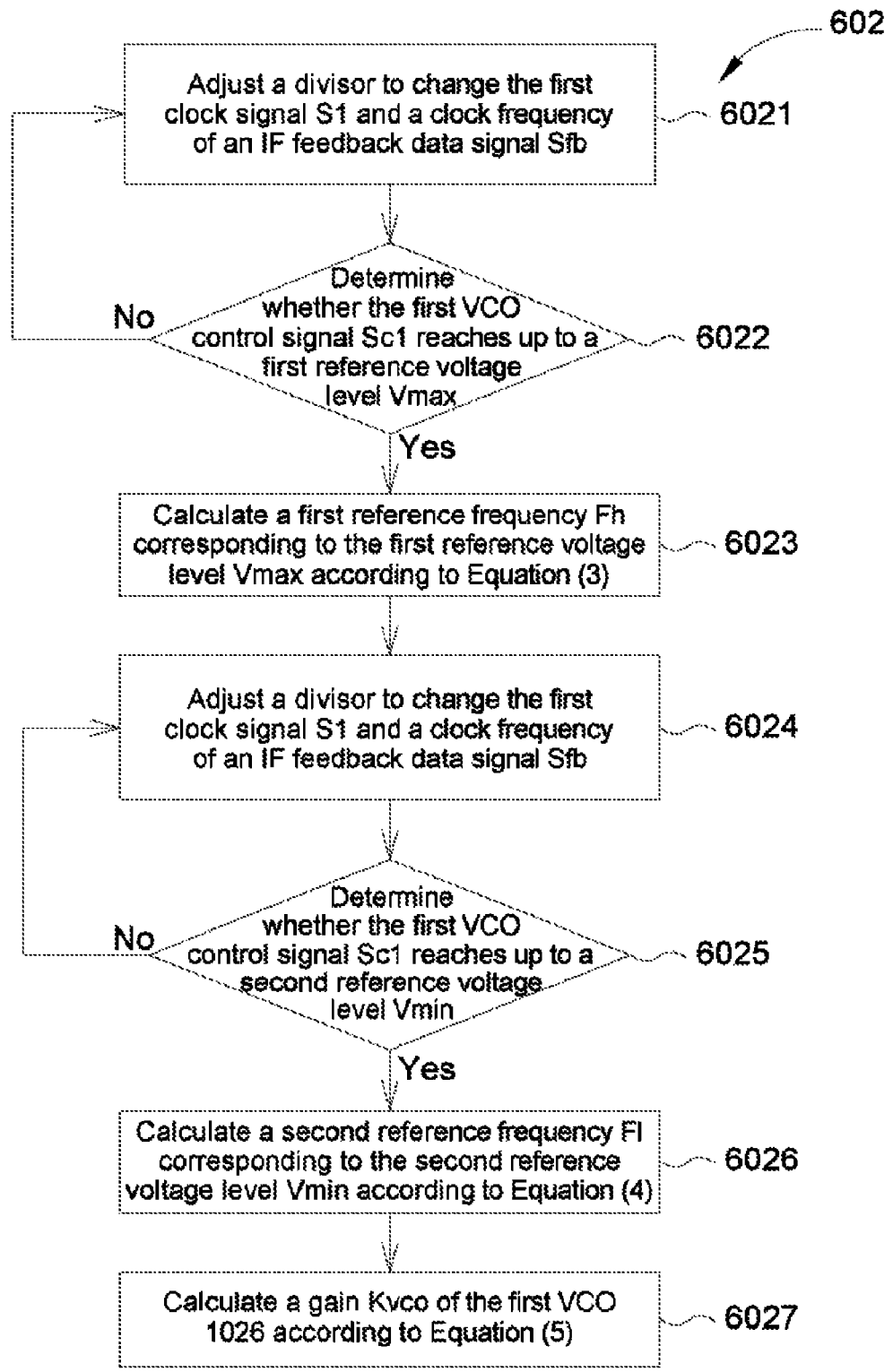
FIG. 7 is a Flow chart of a method for calculating a gain of a VCO in accordance with an embodiment of the present invention.

Upon being activated, the offset PLL transmitter 100 receives a baseband to-be-transmitted data Sdin. As mentioned above, the close loop bandwidth Fbw of the offset PLL 102 of the offset PLL transmitter 100 may not be a predetermined close loop bandwidth. Therefore, the control circuit 1032 performs Step 602 and Step 604 to calibrate the close loop bandwidth Fbw of the offset PLL 102 to the predetermined close loop bandwidth as shown in FIG. 2. In addition, in Step 602, a method for calculating the gain Kvco of the first VCO 110 is described in detail in FIG. 7, which shows a Flow chart of the method for calculating the gain Kvco of the first VCO 1126 in accordance with an embodiment of the present invention.

In Step 6021, adjust a divisor of the first frequency divider 1048 to change the first clock signal 51 and a clock frequency of an IF feedback data signal Sfb. In Step 6022, determine whether the first VCO control signal Sc1 reaches up to a first reference voltage level Vmax. If negative, go back to Step 6021; otherwise, jump to Step 6023. In Step 6023, calculate a fastest output clock frequency Fh corresponding to the first reference voltage level Vmax according to Equation (3). In Step 6024, adjust a divisor of the first frequency divider 1048 to change the first clock signal 51 and the clock frequency of the IF feedback data signal Sfb. In Step 6025, determine whether the first VCO control signal Sc1 reaches up to a second reference voltage level Vmin. If negative, go back to Step 6024; otherwise, jump to Step 6026. In Step 6026, calculate a slowest output clock frequency Fl corresponding to the second reference voltage level Vmin according to Equation (4). In Step 6027, calculate a gain Kvco of the first VCO 1026 according to Equation (5).

In Step 6021 and Step 6022, the adjusting circuit 1035 adjusts the divisor of the first frequency divider 1048 to change the clock frequency Fs1 of the first clock signal 51 until the first VCO control signal Sc1 reaches up to the first reference voltage level Vmax. When the first VCO control signal Sc1 reaches up to the first reference voltage level Vmax, the divisor of the first frequency divider is a first divider Nd1, such that the fastest output clock frequency Fh corresponding to the first reference voltage level Vmax is calculated according to Equation (3) in Step 6023. Likewise, the offset PLL transmitter 100 performs Steps 6024 to 6026 to obtain the slowest output clock frequency Fl corresponding to the second reference voltage level Vmin. When the first VCO control signal Sc1 reaches up to the second reference voltage level Vmin, the divisor of the first frequency divider is a second divider Nd2, such that the slowest output clock frequency Fl corresponding to the second reference voltage level Vmin is calculated according to Equation (4) in Step 6026.

It is to be noted that, in this embodiment, Step 6021 and Step 6024 may be combined to a single step while the two steps are divided for illustration purposes. In Step 6027, after the fastest output clock frequency Fh and the slowest output clock frequency Fl are obtained, the adjusting circuit 1035 calculates the gain Kvco of the first VCO 1026 according to Equation (5). In Step 604, the adjusting circuit 1035 adjusts a reference current Iref of the first phase detecting circuit 1022 according to the gain Kvco, such that a corner frequency Fc of the offset PLL 102 approximately stays unchanged, and thus the close loop bandwidth Fbw of the offset PLL 102 approximately stays unchanged either.

Figure 8:
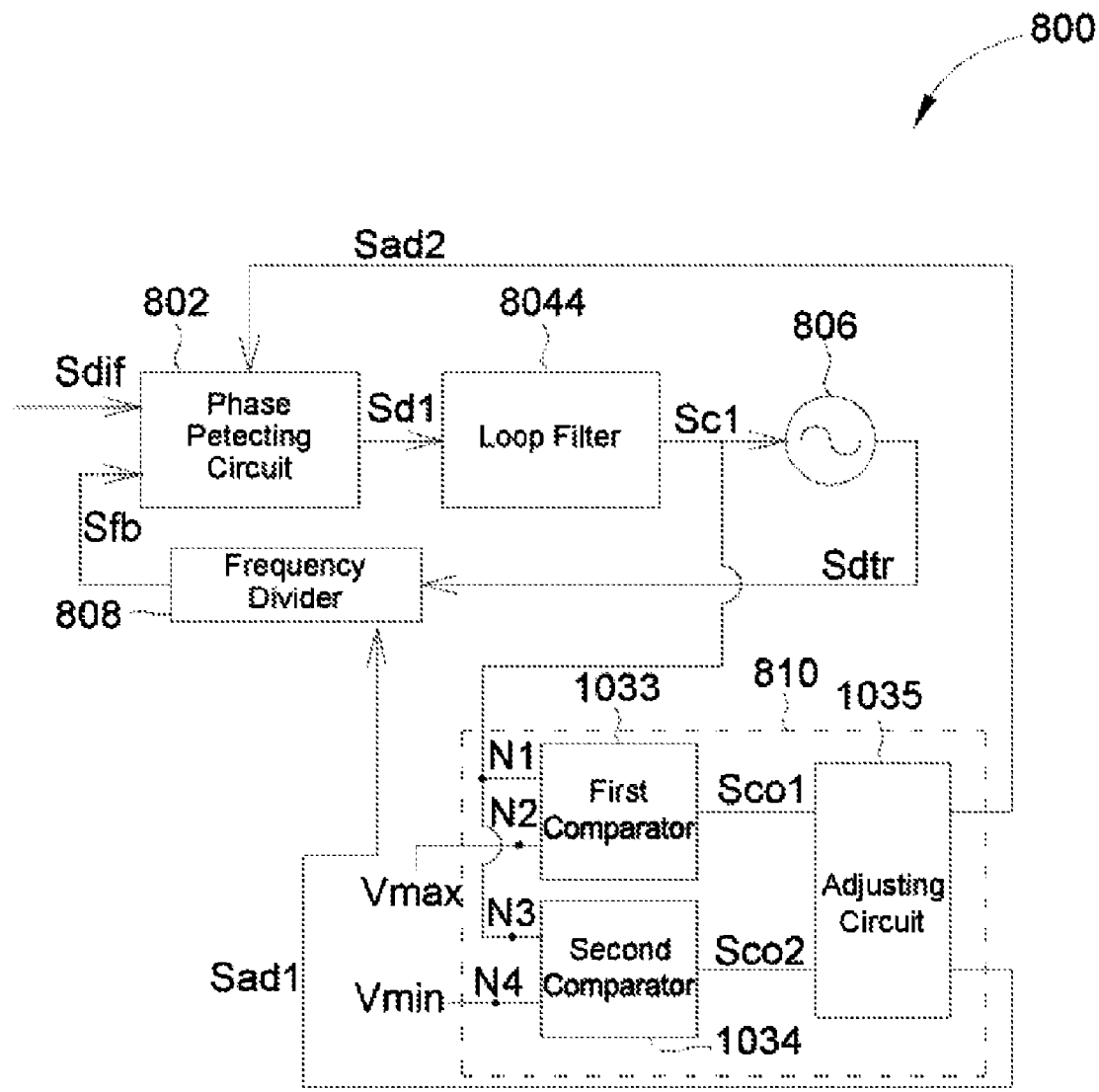
FIG. 8 is a PLL in accordance with an embodiment of the present invention.

Refer to FIG. 8 showing a PLL 800 in accordance with another embodiment of the present invention. The PLL 800 comprises a phase detecting circuit 802, a loop filter 8044, a VCO 806, a frequency divider 808, and a control circuit 810. A difference between the PLL 800 in this embodiment and the offset PLL 102 in FIG. 1 is that, the first mixer 1028 is replaced by the frequency divider 808 in this embodiment, so that the control circuit 810 directly controls the frequency divider 808 to obtain a gain of the VCO 806 via an approach of changing a divisor of the frequency divider 808. The circuit structure and operations of the control circuit 810 are identical to those of the control circuit 1032 in FIG. 1. The phase detecting circuit 802 or the loop filter 8044 is adjusted according to the gain, such that a close loop bandwidth Fbw of the PLL 800 approximately stays unchanged.

While the invention has been described in terms of what is presently considered to be the most practical and preferred embodiments, it is to be understood that the invention needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A phase-locked loop (PLL), comprising:
   a first phase detecting circuit, for detecting a first phase difference between an input data signal and a first feedback signal, and generating a detection output signal according to the phase difference;
   a first loop filter, coupled to the first phase detecting circuit, for generating a first voltage-controlled oscillator (VCO) control signal according to the detection output signal;
   a first voltage-controlled oscillator (VCO), coupled to the first loop filter, for generating an output data signal according to the first VCO control signal;
   a clock generating circuit, for generating a first clock signal;
   a first mixer, coupled to the first VCO and the clock generating circuit, for mixing the output data signal and the first clock signal to generate the first feedback signal; and
   a control circuit, coupled to the clock generating circuit and the first loop filter, for adjusting the first clock signal and calculating a gain of the first VCO according to the first VCO control signal, comprising:
      a first comparator, for comparing the first VCO control signal with a first reference voltage to generate a first comparison result;
      a second comparator, for comparing the first VCO control signal with a second reference voltage to generate a second comparison result; and
      an adjusting circuit, for adjusting the first clock signal according to the first comparison result to obtain a first reference frequency when the first VCO control signal approximately equals to the first reference voltage, adjusting the first clock signal according to the second comparison result to obtain a second reference frequency when the first VCO control signal approximately equals to the second reference voltage, and calculating the gain of the first VCO according to the first reference voltage the second reference voltage, the first reference frequency, and the second reference frequency.

2. The PLL as claimed in claim 1, wherein the control circuit changes a close loop bandwidth of the PLL by adjusting a reference current of the first phase detecting circuit according to the gain.

3. A phase-locked loop (PLL), comprising:
   a first phase detecting circuit, for detecting a first phase difference between an input data signal and a first feedback signal, and generating a detection output signal according to the phase difference;
   a first loop filter, coupled to the first phase detecting circuit, for generating a first voltage-controlled oscillator (VCO) control signal according to the detection output signal;
   a first voltage-controlled oscillator (VCO), coupled to the first loop filter, for generating an output data signal according to the first VCO control signal;
   a clock generating circuit, for generating a first clock signal;
   a first mixer, coupled to the first VCO and the clock generating circuit, for mixing the output data signal and the first clock signal to generate the first feedback signal;
   a control circuit, coupled to the clock generating circuit and the first loop filter, for adjusting the first clock signal and calculating a gain of the first VCO according to the first VCO control signal;
   a second phase detecting circuit, for detecting a second phase difference between an input clock signal and a feedback clock signal to generate a second VCO control signal;
   a second VCO, coupled to the second phase detecting circuit, for generating the first clock signal according to the second VCO control signal; and
   a first frequency divider, coupled to the second VCO and the second phase detecting circuit, for frequency dividing the first clock signal to generate the feedback clock signal according to the first frequency divider provided by the control circuit
   wherein the control circuit controls the first frequency divider to change the first clock signal to obtain a first reference frequency when the first VCO control signal approximately equals the first reference voltage; controls the first frequency divider to change the first clock signal to obtain a second reference frequency when the first VCO control signal approximately equals the second reference voltage and calculates the gain of the first VCO according to the first reference voltage the second reference voltage, the first reference frequency, and the second reference frequency.

4. The PLL as claimed in claim 3, further comprising a signal processing circuit for converting a to-be-transmitted data signal to the input data signal, the signal processing circuit comprising:
  a phase shifter, for generating a first offset clock signal and a second offset clock signal according to a second clock signal;
  a second mixer, for mixing the to-be-transmitted data signal according to the first offset clock signal to generate the input data signal; and
  a third mixer, for mixing the to-be-transmitted data signal according to the second offset clock signal to generate the input data signal.

5. The PLL as claimed in claim 4, wherein the clock generating circuit further comprises:
  a second frequency divider, coupled between the second VCO and the signal processing circuit, for frequency dividing the first clock signal to generate the second clock signal.

6. A method for calibrating a close loop bandwidth of a PLL comprising a VCO and a phase detector detection circuitry, comprising:
  (a) determining a first reference frequency by adjusting a clock signal according to a VCO control signal and a first reference voltage as the VCO control signal approaches the first reference voltage, comparing the VCO control signal with the first reference voltage to generate a first comparison result, and if the first comparison indicating that the VCO control signal approaches the first reference voltage, determining the first reference frequency, otherwise, adjusting the clock signal according to the first comparison and then repeating comparing the VCO control signal with the first reference voltage to generate a first comparison result;
  (b) determining a second reference frequency by adjusting the clock signal according to the VCO control signal and a second reference voltage as the VCO control signal approaches the second reference voltage; and
  (c) calculating a gain of the VCO according to the first reference voltage, the second reference voltage, the first reference frequency, and the second reference frequency.

7. The calibration method as claimed in claim 6, further comprising:
  (d) adjusting the phase detection circuitry according to the gain to retain a close loop bandwidth of the PLL.

8. A method for calibrating a close loop bandwidth of a PLL comprising a VCO and a phase detection circuitry, comprising:
  (a) determining a first reference frequency by adjusting a clock signal according to a VCO control signal and a first reference voltage as the VCO control signal approaches the first reference voltage;
  (b) determining a second reference frequency by adjusting the clock signal according to the VCO control signal and a second reference voltage as the VCO control signal approaches the second reference voltage, comparing the VCO control signal with the second reference voltage to generate a second comparison result, and if the second comparison indicating that the VCO control signal approaches the second reference voltage, determining a the second reference frequency, otherwise, adjusting the clock signal according to the second comparison and then repeating comparing the VCO control signal with the second reference voltage to generate a second comparison result; and
  (c) calculating a gain of the VCO according to the first reference voltage, the second reference voltage, the first reference frequency, and the second reference frequency.

* * * * *